(12) United States Patent
Reznicek et al.

(10) Patent No.: US 11,411,049 B2
(45) Date of Patent: Aug. 9, 2022

(54) SYMMETRIC READ OPERATION RESISTIVE RANDOM-ACCESS MEMORY CELL WITH BIPOLAR JUNCTION SELECTOR

(71) Applicant: International Business Machines Corporation, Armonk, NY (US)

(72) Inventors: Alexander Reznicek, Troy, NY (US); Bahman Hekmatshoartabari, White Plains, NY (US); Ruilong Xie, Niskayuna, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 17/128,352

(22) Filed: Dec. 21, 2020

(65) Prior Publication Data

US 2022/0199688 A1 Jun. 23, 2022

(51) Int. Cl.
*G11C 16/04* (2006.01)
*H01L 27/24* (2006.01)
(Continued)

(52) U.S. Cl.
CPC ........ *H01L 27/2445* (2013.01); *G11C 13/004* (2013.01); *G11C 13/0007* (2013.01);
(Continued)

(58) Field of Classification Search
CPC .............. G11C 13/0007; G11C 13/004; G11C 13/0069; G11C 2213/79; H01L 27/2445;
(Continued)

(56) References Cited

U.S. PATENT DOCUMENTS 5,547,893 A * 8/1996 Sung ................... H01L 27/0623
438/210
8,431,921 B2 4/2013 Pickett
(Continued)

FOREIGN PATENT DOCUMENTS

CN 102201429 A 9/2011
CN 103650145 A 3/2014
EP 3229282 A1 10/2017

OTHER PUBLICATIONS

International Search Report and Written Opinion, International Application No. PCT/CN2021/128080, dated Jan. 28, 2022, 9 pages.
(Continued)

*Primary Examiner* — Pho M Luu
(74) *Attorney, Agent, or Firm* — Michael A. Petrocelli

(57) ABSTRACT

A memory device, and a method of making the same, includes a resistive random-access memory element electrically connected to an extrinsic base region of a bipolar junction transistor, the extrinsic base region of the bipolar junction transistor consisting of an epitaxially grown material that forms the bottom electrode of the resistive random-access memory element. Additionally, a method of writing to the memory device includes applying a first voltage on a word line of the memory device to form a filament in the resistive random-access memory element. A second voltage including an opposite polarity to the first voltage can be applied to the word line to remove a portion of the filament in the resistive random-access memory element.

15 Claims, 6 Drawing Sheets

(51) Int. Cl.
*H01L 45/00* (2006.01)
*H01L 29/737* (2006.01)
*H01L 29/08* (2006.01)
*H01L 29/10* (2006.01)
*H01L 29/66* (2006.01)
*G11C 13/00* (2006.01)

(52) U.S. Cl.
CPC ...... *G11C 13/0069* (2013.01); *H01L 29/0817* (2013.01); *H01L 29/0821* (2013.01); *H01L 29/1004* (2013.01); *H01L 29/66242* (2013.01); *H01L 29/7371* (2013.01); *H01L 45/16* (2013.01); *G11C 2213/79* (2013.01)

(58) Field of Classification Search
CPC ............. H01L 29/0817; H01L 29/1004; H01L 29/7371
See application file for complete search history.

(56) References Cited

U.S. PATENT DOCUMENTS

| | | | |
|---|---|---|---|
| 8,884,285 B2* | 11/2014 | Lu | H01L 45/00 257/3 |
| 9,412,942 B2 | 8/2016 | Walls | |
| 9,466,794 B2 | 10/2016 | Yang | |
| 9,792,987 B1* | 10/2017 | Chou | G11C 13/0069 |
| 10,003,021 B2 | 6/2018 | Walls | |
| 10,141,504 B2 | 11/2018 | Shifren | |
| 10,211,397 B1 | 2/2019 | Jo | |
| 2013/0009280 A1 | 1/2013 | Camillo-Castillo | |
| 2016/0079310 A1 | 3/2016 | Tran | |
| 2016/0148978 A1 | 5/2016 | Hsu | |
| 2017/0323929 A1* | 11/2017 | Bessonov | G11C 13/0007 |

OTHER PUBLICATIONS

Reznicek, et al., "Symmetric Read Operation Resistive Random-Access Memory Cell With Bipolar Junction Selector", International Application No. PCT/CN2021/128080, International Filing Date Nov. 2, 2021, 26 pages.

Aluguri, et al., "One bipolar transistor selector—One resistive random access memory device for cross bar memory array", AIP Advances 7, 095118, 2017, 8 pages, <https://aip.scitation.org/doi/pdf/10.1063/1.4994948>.

* cited by examiner

SYMMETRIC READ OPERATION RESISTIVE RANDOM-ACCESS MEMORY CELL WITH BIPOLAR JUNCTION SELECTOR

BACKGROUND

The present invention generally relates to the field of memory devices, and more particularly to fabricating a symmetric read operation resistive random-access memory bit cell with a bipolar junction selector.

Emerging memory applications such as resistive random-access memory (RRAM) require bidirectional selection for efficient operation. Transistor selectors enable bidirectional operation but introduce some read asymmetry because depending on the voltage polarity of the operation, the field-effect (or bipolar) transistor terminal connected to the memory element may be the functional drain (or emitter) or the functional source (or collector). This issue can be addressed by using additional transistors in the bit cell. However, using additional transistors results in an increased bit cell area.

SUMMARY

There is a need for alternative designs and techniques for forming a memory bit cell that can prevent asymmetry issues while reducing bit cell area. Therefore, embodiments of the present invention provide a memory device including a bipolar junction transistor (BJT) with a RRAM element integrated onto an extrinsic base region of the BJT. The proposed structure and integration method can, among other benefits, provide symmetric read operation and enable small device footprint.

According to an embodiment, a memory device includes a resistive random-access memory element electrically connected to an extrinsic base region of a bipolar junction transistor, the extrinsic base region of the bipolar junction transistor consisting of an epitaxially grown material that forms the bottom electrode of the resistive random-access memory element. The epitaxially grown material includes a high dopant concentration and a triangle-shaped top region.

According to another embodiment, a method of writing to a memory device includes applying a first voltage on a word line of the memory device, the memory device including a resistive random-access memory element electrically connected to an extrinsic base of a bipolar junction transistor, applying the first voltage forms a filament in the resistive random-access memory element. A second voltage including an opposite polarity to the first voltage can be applied on the word line to remove a portion of the filament in the resistive random-access memory element. A third voltage can be applied between the word line and at least one of a bit line and a select line to activate a read operation in the resistive random-access memory element.

According to yet another embodiment, a method of forming a memory structure includes forming a resistive random-access memory element electrically connected to an extrinsic base region of a bipolar junction transistor, the extrinsic base region of the bipolar junction transistor consisting of an epitaxially grown material that forms the bottom electrode of the resistive random-access memory element.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
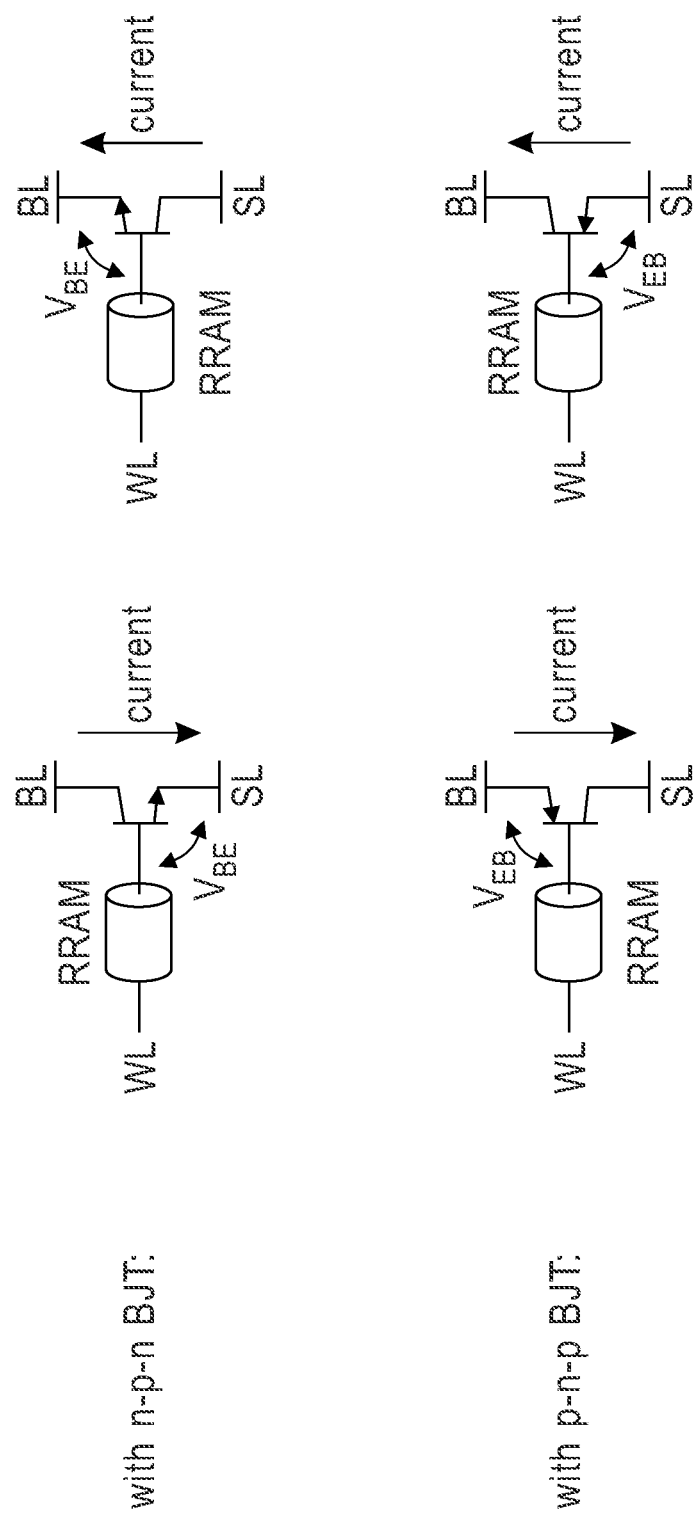
FIG. 1 depicts an exemplary one-transistor-one-resistor RRAM structure with BJT selector configured according to embodiments of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Resistive random access memory (RRAM) is one of the emerging non-volatile memory technologies due to its simple structure, high density, low operating power read/write operations, fast read and write speeds. A selector device connected in series with the RRAM device can be used to improve the sneak path current of RRAM devices and fabricate high density, large size cross bar memory arrays. RRAM is the memory using the switch of resistance under electric field to record information, where the high and low resistance states correspond to the logic 0 and 1, respectively.

In traditional memory cells (BJT/RRAM and/or FET/RRAM), because of the voltage drop across the RRAM, the gate-to-source voltage $V_{GS}$ (or base-to-emitter voltage $V_{BE}$) and therefore the transistor drive current are smaller when the transistor terminal connected to the RRAM is the functional source (or functional collector) compared to when it is the functional drain (or the functional emitter). This results in the well-known asymmetrical read operation issue.

To solve this problem, embodiments of the present invention, provide a memory cell structure including a RRAM element integrated onto an extrinsic base region of a BJT that allows symmetric circuit operation. FIG. 1 depicts an exemplary one-transistor-one-resistor (1T1R) RRAM structure with BJT selector configured according to embodiments of the present invention. Specifically, in the depicted circuit, the RRAM element is connected to a base terminal of the BJT. Accordingly, during the write operation, a filament can be formed in the RRAM element by applying a positive (or negative) voltage on a word line (WL) with respect to a bit line (BL) or select-line (SL) for n-p-n (or p-n-p) BJT thus forward biasing the p-n junction, whereas during the erase operation, filament removal can be performed by applying a negative (positive) voltage on WL with respect to BL or SL for n-p-n (p-n-p) BJT thus bringing the p-n junction into punch-through or avalanche breakdown. Voltage polarities opposite to that described above can also be used for filament formation and removal, but are typically less efficient.

With continued reference to FIG. 1, the read operation is the same as traditional memory cells; however, in contrast to traditional memory cells, the amplitude of the read current $I_{READ}$ is independent of the polarity of the voltage applied between the BL and SL which determines the direction of $I_{READ}$ flow. This is because the RRAM element is connected to the base terminal of the BJT rather than its collector or emitter. For a read voltage $V_{READ}$ applied between WL and BL or SL lines of a memory cell with an n-p-n BJT selector: $I_B=(V_{READ}-V_{BE})/R_{RRAM}$, where $V_{BE} \approx 0.7V$ for silicon, $I_C=\beta I_B$ and $I_E=I_C+I_B \approx I_C$, where $I_B$ is the base current, $V_{BE}$ is the base-emitter voltage, $R_{RRAM}$ is the resistance of the resistive memory element, $I_C$ is the collector current, $I_E$ is the emitter current, R is the BJT gain, and $I_{READ}=I_C$ or $I_E$. For a memory cell with a p-n-p BJT, $V_{BE}$ is replaced with $V_{EB}$ (emitter-base voltage) in above expressions. As seen from above expressions, the amplitude of $I_{READ}$ does not depend on its direction, thus eliminating the asymmetric read operation issue.

Therefore, embodiments of the present disclosure provide a memory device, and a method of making the same, including a bipolar junction transistor (BJT) with a RRAM element integrated onto an extrinsic base region of the BJT that allows symmetric read operation. The proposed structure and integration method can also enable small device footprint, and thus denser memory cells. An embodiment by which the memory device with RRAM element integrated onto the extrinsic base region of the BJT can be formed is described in detailed below by referring to the accompanying drawings in FIGS. 1-11.

Figure 2:
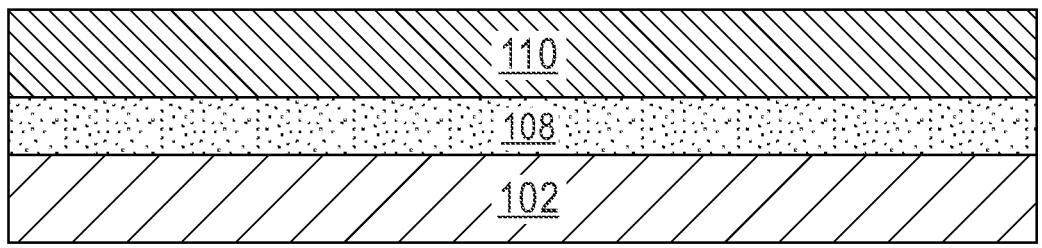
FIG. 2 is a cross-sectional view of a memory device at an initial step during a manufacturing process, according to an embodiment of the present disclosure.

Referring now to FIG. 2, a cross-sectional view of a memory device 100 is shown at an initial step during a manufacturing process, according to an embodiment of the present disclosure.

At this step of the manufacturing process, the memory device 100 may include a semiconductor-on-insulator (SOI) substrate where a buried dielectric layer 108 (i.e., buried oxide or BOX layer) separates a (base) semiconductor substrate 102 from a top semiconductor layer 110. The components of the memory device 100 can then be formed from the top semiconductor layer 110. In other embodiments, a bulk semiconductor substrate can be used in the fabrication process.

In this embodiment, the semiconductor-on-insulator substrate formed by the semiconductor substrate 102, buried dielectric layer 108 and top semiconductor layer 110 includes a silicon-germanium-on-insulator substrate. Accordingly, the buried dielectric layer 108 isolates the top semiconductor layer 110 from the semiconductor substrate 102. The semiconductor substrate 102 may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide. In this embodiment, the semiconductor substrate 102 is made of single-crystalline silicon (Si). Typically the semiconductor substrate 102 may be approximately several hundred microns thick. For example, the semiconductor substrate 102 may include a thickness varying from approximately 600 micrometer to approximately 1,000 micrometer, and ranges therebetween.

The buried dielectric layer 108 (i.e., BOX layer) may be formed from any of several known dielectric materials. Non-limiting examples include oxides, nitrides and oxynitrides of silicon. Oxides, nitrides and oxynitrides of other elements are also envisioned. In addition, the buried dielectric layer 108 may include crystalline or non-crystalline dielectric material. Moreover, the buried dielectric layer 104 may be formed using any of several known methods. Non-limiting examples include ion implantation methods, thermal or plasma oxidation or nitridation methods, chemical vapor deposition methods and physical vapor deposition methods. According to an embodiment, the buried dielectric layer 108 may include a thickness varying from approximately 20 nm to approximately 200 nm, and ranges therebetween.

In some embodiments, depending on design requirements, the semiconductor substrate 102 and the top semiconductor layer 110 may include either identical or different semiconductor materials with respect to chemical composition, dopant concentration and crystallographic orientation. In this embodiment, the top semiconductor layer 110 is made of silicon-germanium (SiGe). Specifically, the top semiconductor layer 110 includes a single-crystalline SiGe layer with a 20% germanium concentration. Methods for forming the top semiconductor layer 110 are well known in the art. Non-limiting examples include wafer bonding or thermal mixing. The top semiconductor layer 110 may include a thickness varying from approximately 6 nm to approximately 100 nm, and ranges therebetween.

Figure 3:
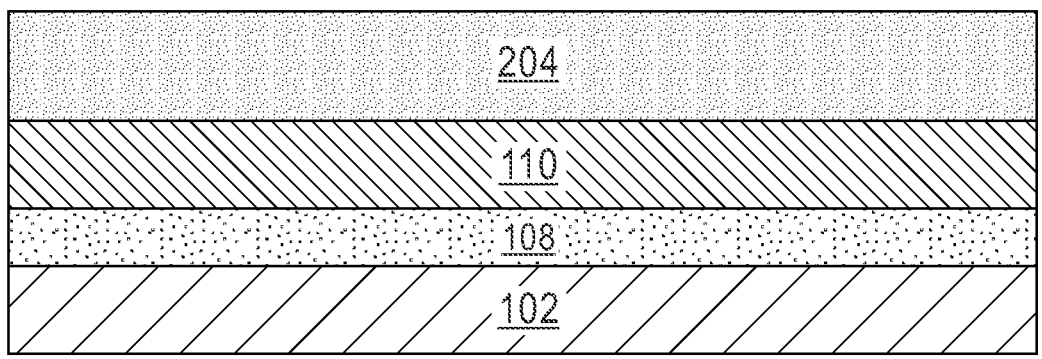
FIG. 3 is a cross-sectional view of the memory device after forming an extrinsic base layer, according to an embodiment of the present disclosure.

Referring now to FIG. 3, a cross-sectional view of the memory device 100 is shown depicting forming an extrinsic base layer 204, according to an embodiment of the present disclosure. The extrinsic base layer 204 is formed directly above the top semiconductor layer 110. In this embodiment, the extrinsic base layer 204 includes an epitaxially grown single-crystalline silicon (Si) layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon (Si) layer can be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon-germanium layer can be formed utilizing a combination of the aforementioned gas sources. Carrier gases like hydrogen, nitrogen, helium and argon can be used.

According to the proposed embodiments, the extrinsic base layer 204 may function as an extrinsic base region for a subsequently formed bipolar junction transistor, while the top semiconductor layer 110 may function as an intrinsic base region for the same bipolar junction transistor, as will be described in detail below.

Figure 4:
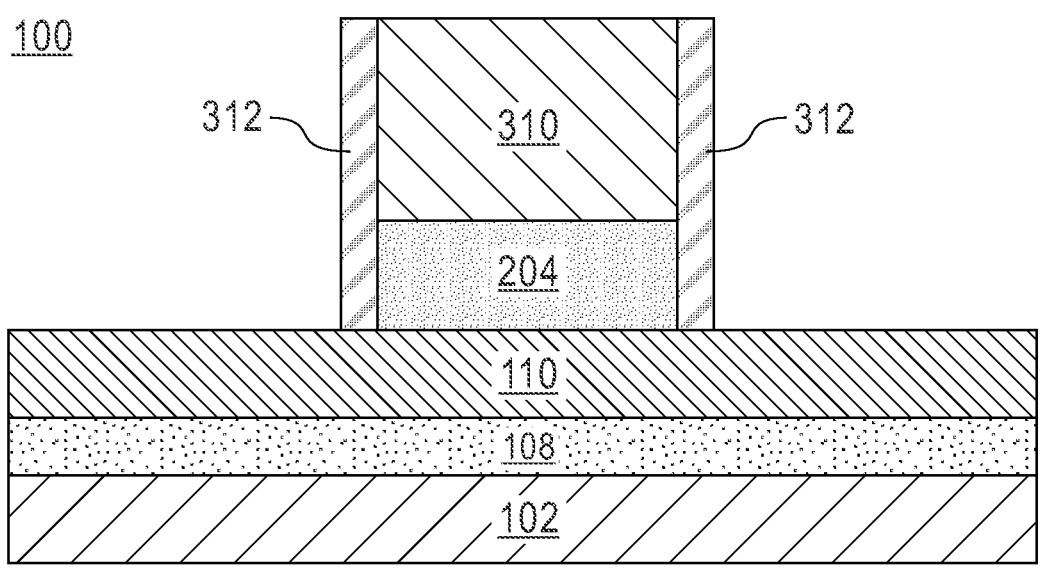
FIG. 4 is cross-sectional view of the memory device after forming a hardmask layer followed by patterning of the extrinsic base layer and formation of sidewall spacers, according to an embodiment of the present disclosure.

Referring now to FIG. 4, a cross-sectional view of the memory device 100 is shown after forming a hardmask layer 310 followed by patterning of the extrinsic base layer 204 and formation of sidewall spacers 312, according to an embodiment of the present disclosure.

The hardmask layer 310 can include a dielectric material such as silicon dioxide, silicon nitride, silicon carbide, and the like, and can be deposited by any suitable deposition method known in the art. The process of patterning the extrinsic base layer 204 consists of steps well-known in the art, which generally include forming a pattern on a photoresist layer (not shown) that is transferred to the hardmask layer 310 and used to pattern the underlying extrinsic base layer 204 via any suitable etching technique.

After the patterning process, a spacer material can be deposited on the memory device 100 and subsequently etched to form sidewall spacers 312 as configured in FIG. 4. A final thickness of the hardmask layer 310 may vary between approximately 50 nm to approximately 150 nm, although other thicknesses above or below this range may be used as desired for a particular application.

The spacer material forming the sidewalls spacers 312 may include an insulator material such as an oxide, nitride, oxynitride, silicon carbon oxynitride, silicon boron oxynitride, low-k dielectric, or any combination thereof. Standard deposition and etching techniques may be used to form the sidewalls spacers 312. For example, the spacer material can be etched using an anisotropic etch and form the sidewall spacers 312. As known by those skilled in the art, the spacer material forming the sidewalls spacers 312 is removed from all horizontal surfaces of the memory device 100 during the etching process.

As can be observed in the figure, the sidewall spacers 312 are located on sidewalls of the extrinsic base layer 204 and the hardmask layer 310. According to an embodiment, a width of the sidewall spacers 312 may vary between approximately 6 nm to approximately 12 nm, although other thicknesses above or below this range may be used as desired for a particular application.

Figure 5:
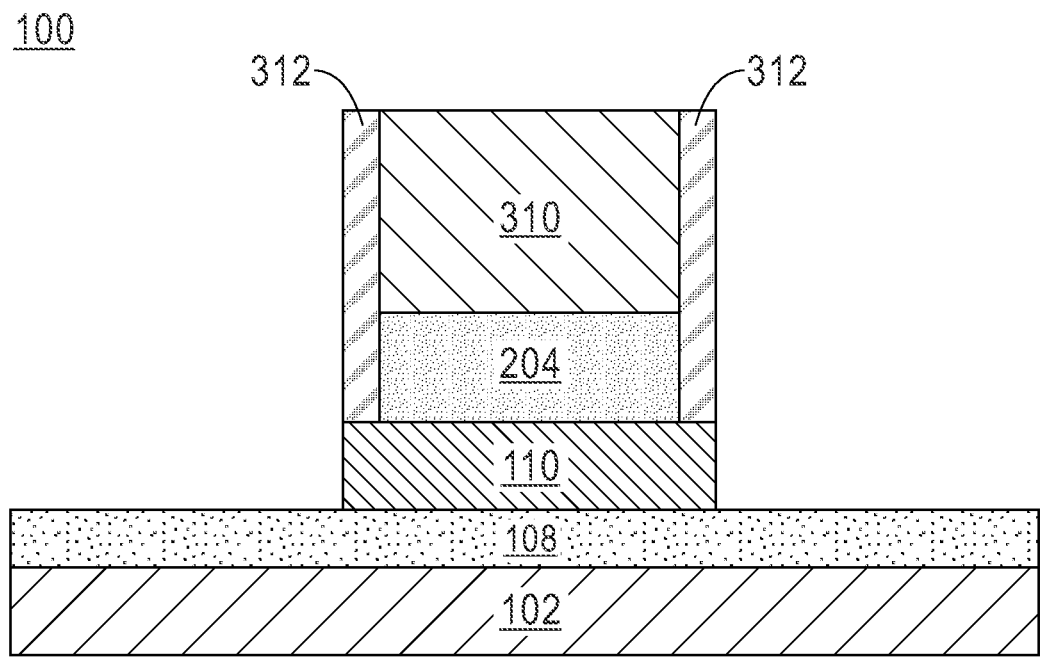
FIG. 5 is a cross-sectional view of the memory device after recessing a semiconductor layer, according to an embodiment of the present disclosure.

Referring now to FIG. 5, a cross-sectional view of the memory device 100 after recessing the top semiconductor layer 110 is shown, according to an embodiment of the present disclosure. Known etching techniques can be applied to recess the top semiconductor layer 110. In an exemplary embodiment, a reactive ion etching (RIE) process can be used to recess the top semiconductor layer 110.

As illustrated in the figure, after etching a final width of the top semiconductor layer 110 is equal to a width of the extrinsic base layer 204 plus a width of the sidewall spacers 312. Stated differently, the top semiconductor layer 110 is recessed until outer surfaces of the top semiconductor layer 110 perpendicular to the semiconductor substrate 102 are coplanar with outer surfaces of the sidewalls spacers 312.

The following described embodiments depict the formation of a bipolar junction transistor (BJT) in the memory device 100 for which the recessed top semiconductor layer 110 constitutes the base region. Specifically, the processing steps illustrated in FIGS. 6-7 describe the formation of emitter and collector regions on opposed sides of the recessed top semiconductor layer 110 (i.e., base region).

Figure 6:
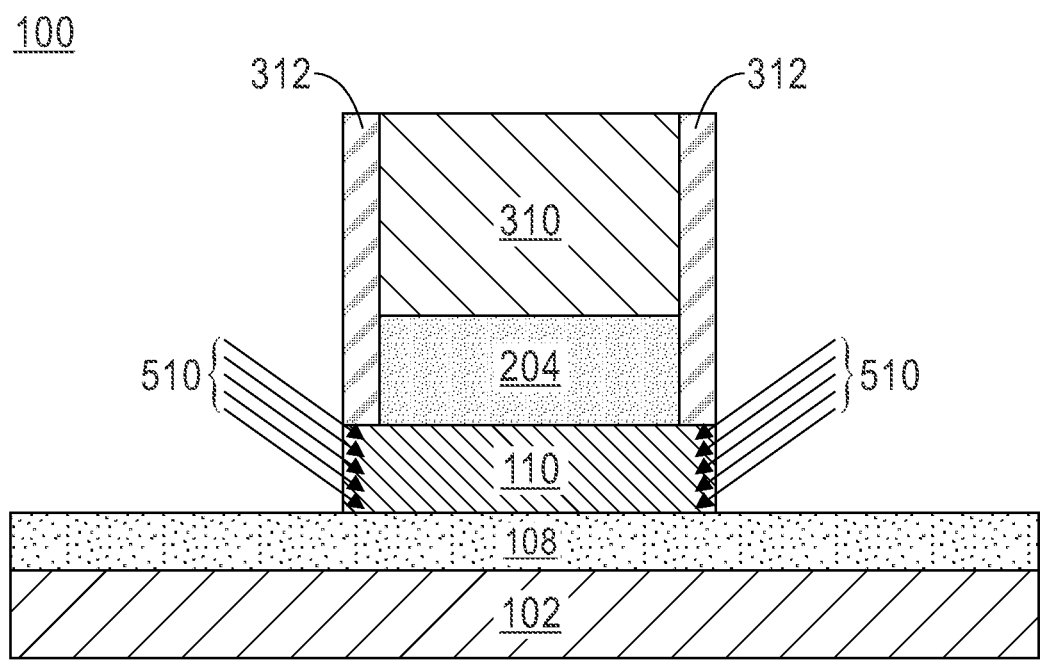
FIG. 6 is a cross-sectional view of the memory device depicting an ion implantation process, according to an embodiment of the present disclosure.

Referring now to FIG. 6, a cross-sectional view of the memory device 100 depicting an ion implantation process is shown, according to an embodiment of the present disclosure. The ion implantation process is conducted prior to forming emitter and collector regions of the BJT.

As known by those skilled in the art, BJTs are three-terminal electronic devices that include three semiconductor regions, namely an emitter, a base, and a collector. Generally, a BJT includes a pair of p-n junctions, namely a collector-base junction and an emitter-base junction. A voltage applied across the emitter-base junction of a BJT controls the movement of charge carriers that produce charge flow between the collector and emitter regions of the BJT.

An n-p-n bipolar junction transistor includes two regions of n-type semiconductor material constituting the emitter-collector region, and a region of p-type semiconductor material located between the two regions of n-type semiconductor material constituting the base region of an n-p-n BJT device. A p-n-p bipolar junction transistor has two regions of p-type semiconductor material constituting the emitter-collector region, and a region of n-type semiconductor material located between the two regions of p-type semiconductor material constituting the base region of a p-n-p BJT device.

For illustration purposes only, without intent of limitation, the bipolar transistor being formed in the memory device 100 includes an n-p-n bipolar transistor. Accordingly, in this embodiment, the top semiconductor layer 110 (i.e., base region of the BJT) includes a p-type semiconductor material such as silicon-germanium (SiGe). As known by those skilled in the art, the process of forming a p-n-p bipolar transistor includes similar steps.

Thus, to form the emitter/collector regions of the BJT, an angled ion implantation is conducted on opposing sides of the recessed top semiconductor layer 110, as depicted in the figure by arrows 510. The ion implantation process provides appropriate polarity to the subsequently formed emitter and collector regions (shown in FIG. 7). As mentioned above, embodiments of the present disclosure are illustrated using an n-p-n bipolar junction transistor that includes two regions of n-type semiconductor material and a region of p-type semiconductor material located between the two regions of n-type semiconductor material.

Thus, first ions corresponding to a first polarity are implanted on a first lateral surface 602 and a second lateral surface 604 of the semiconductor layer 110. As may be understood, the first polarity (i.e., p-type or n-type) of the implanted ions is selected according to the type of bipolar transistor being formed. In this embodiment, since an exemplary n-p-n bipolar junction transistor is being formed, p-type dopants are used in the ion implantation process.

As will be described in FIG. 7, an emitter region 620 will be formed from the first lateral surface 602 and a collector region 640 will be formed from the second lateral surface 604.

The process of forming emitter/collector regions for a p-n-p bipolar junction transistor is similar and includes selecting second ions corresponding to a second polarity, i.e., p-type dopants, for the implantation process.

In a preferred embodiment, a hot angled ion implantation can be conducted on the memory device 100. In some embodiments a cold ion implantation can be performed to provide an appropriate polarity to the first lateral surface 602 and the second lateral surface 604 of the semiconductor layer 110.

In embodiments in which a p-type emitter/collector region is formed, p-type dopants, such as boron (B) can be implanted by performing a hot BF2 angled ion implantation on the memory device 100. In embodiments in which an n-type emitter/collector region is formed, n-type dopants, such as phosphorus (P) or arsenic (As) can be implanted by performing a hot As or P angled ion implantation on the memory device 100. A dopant concentration of p-type dopants (i.e., boron) may vary from approximately $1 \times 10^{18}$ ions/cm$^3$ to approximately $9 \times 10^{20}$ ions/cm$^3$, while a dopant concentration of n-type dopants (i.e., arsenic or phosphorus) may vary from approximately $1 \times 10^{18}$ ions/cm$^3$ to approximately $9 \times 10^{20}$ ions/cm$^3$.

Figure 7:
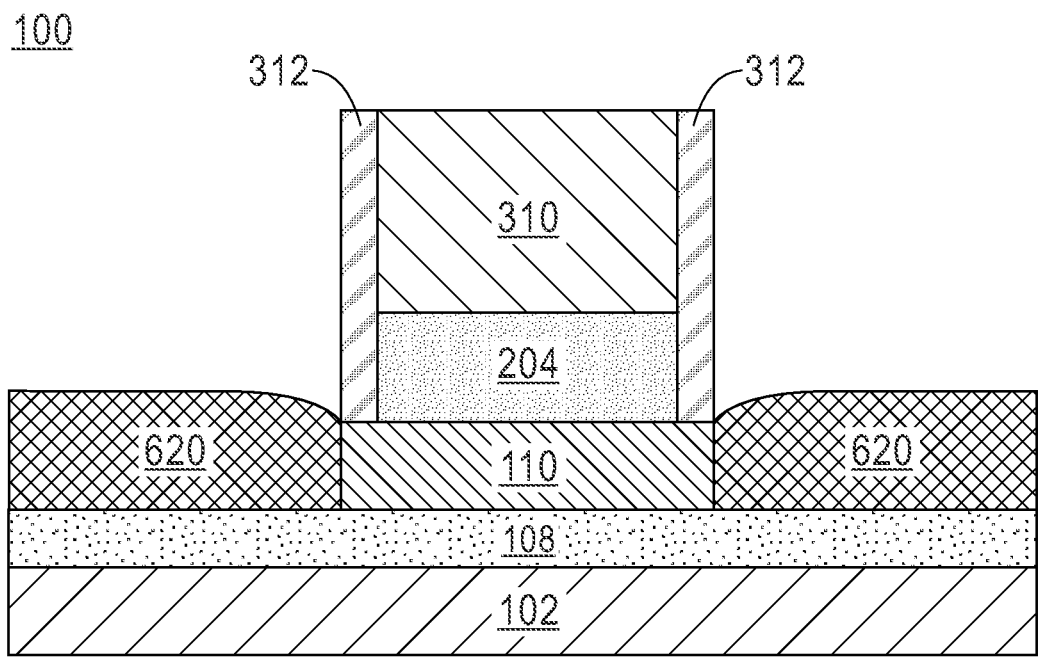
FIG. 7 is a cross-sectional view of the memory device after forming an emitter region and a collector region, according to another embodiment of the present disclosure.

Referring now to FIG. 7, a cross-sectional view of the memory device 100 is shown after forming an emitter region 620 and a collector region 640 of the bipolar junction transistor, according to an embodiment of the present disclosure.

The emitter region 620 and the collector region 640 can be formed by, for example, epitaxial growth of an in-situ doped single-crystalline Si or SiGe layer off the first lateral surface 602 and the second lateral surface 604 of the semiconductor layer 110, respectively. In some embodiments, the emitter region 620 and the collector region 640 may include a material similar to the one forming the base region (i.e., the recessed top semiconductor layer 110), but with a slightly higher bandgap. Epitaxial materials forming the emitter region 620 and the collector region 640 can be grown from gaseous or liquid precursors using low pressure chemical vapor deposition (LPCVD), plasma enhanced chemical vapor deposition (PECVD), atmospheric pressure chemical vapor deposition (APCVD), vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

According to an exemplary embodiment, the emitter region 620 (e.g., n$^+$ Si emitter), the (base) top semiconductor layer 110 (e.g., p-type SiGe), and the collector region 640 (e.g., n$^+$ Si collector) form an n-p-n bipolar transistor in the memory device 100.

Figure 8:
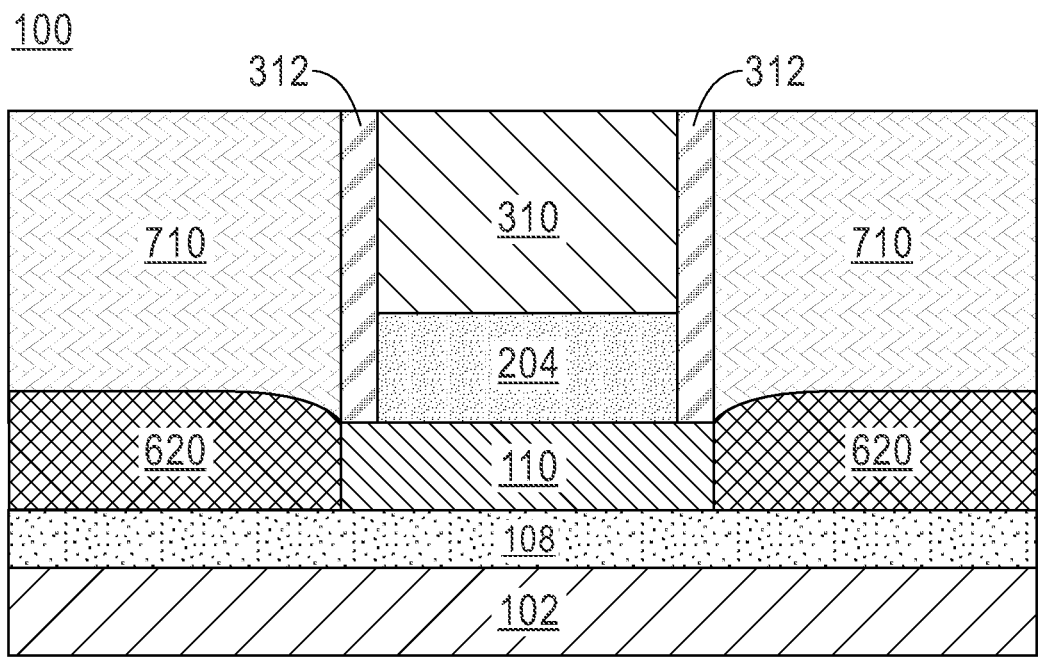
FIG. 8 is a cross-sectional view of the memory device after forming a first dielectric layer, according to an embodiment of the present disclosure.

Referring now to FIG. 8, a cross-sectional view of the memory device 100 is shown after forming a first dielectric layer 710, according to an embodiment of the present disclosure.

After epitaxially growing the emitter region 620 and the collector region 640, a first dielectric layer 710 is formed on the memory device 100, as shown in the figure. The first dielectric layer 710 may be formed by, for example, chemical vapor deposition (CVD) of a dielectric material. Non-limiting examples of dielectric materials to form the first dielectric layer 710 may include silicon oxide, silicon nitride, hydrogenated silicon carbon oxide, silicon based low-k dielectrics, flowable oxides, porous dielectrics, or organic dielectrics including porous organic dielectrics.

In some embodiments, a planarization process such as a chemical mechanical polishing (CMP) can be conducted on the memory device 100 after deposition of the first dielectric layer 710.

Figure 9:
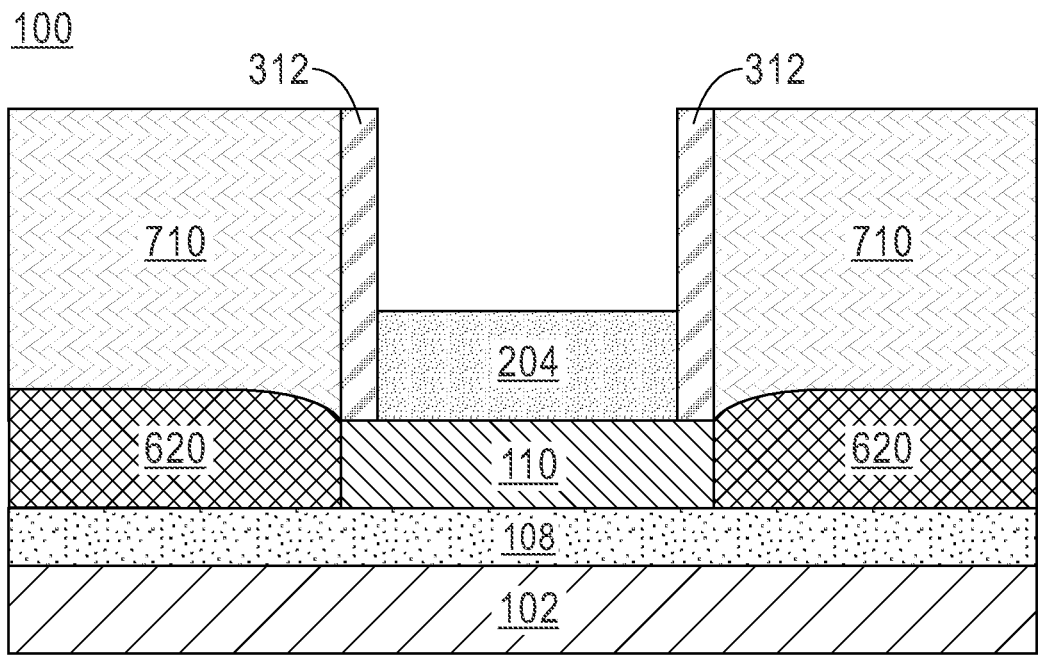
FIG. 9 is a cross-sectional view of the memory device after removing the hardmask layer, according to another embodiment of the present disclosure.

Referring now to FIG. 9, a cross-sectional view of the memory device 100 is shown after removing the hardmask layer 310, according to an embodiment of the present disclosure. In this embodiment, the hardmask layer 310 is selectively removed from the memory device 100 using any suitable isotropic etch process including, for example, an SC1 solution. Removal of the hardmask layer 310 exposes a top surface of the extrinsic base layer 204, as shown in the figure.

Figure 10:
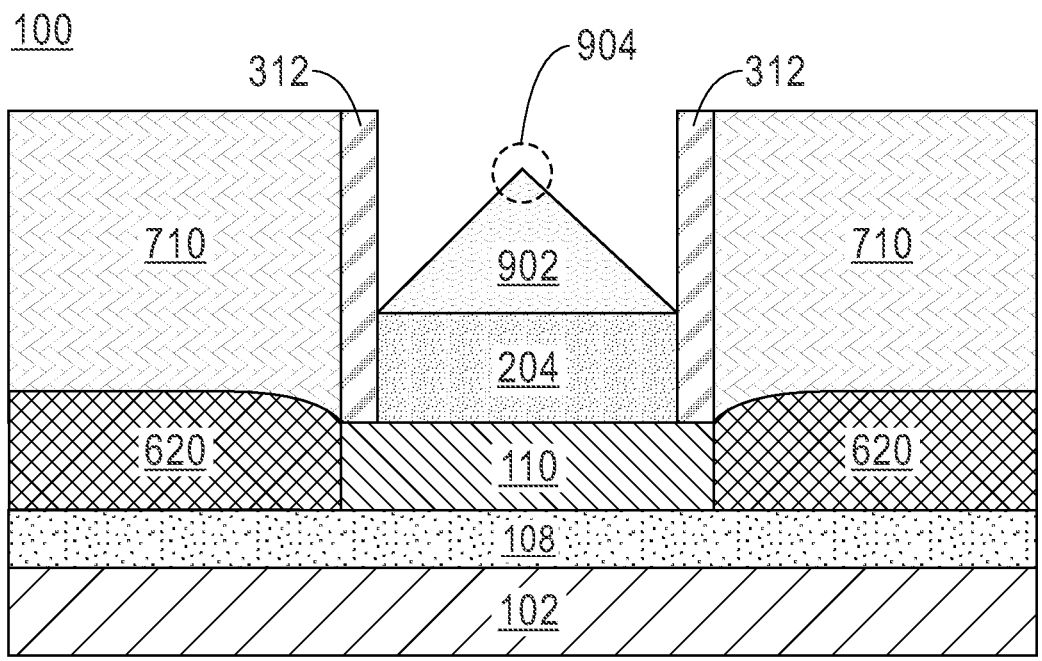
FIG. 10 is a cross-sectional view of the memory device after forming a facetted epitaxy layer, according to another embodiment of the present disclosure.

Referring now to FIG. 10, a cross-sectional view of the memory device 100 is shown after forming a facetted epitaxy layer 902, according to an embodiment of the present disclosure. At this point of the manufacturing process, the facetted epitaxy layer 902 includes an epitaxially grown semiconductor material formed on the exposed top surface of the extrinsic base layer 204 following an epitaxial growth process similar to the one described above with respect to the emitter/collector regions 620, 610 of FIG. 7.

As known by those skilled in the art, the triangular shape observed in a top portion of the facetted epitaxy layer 902 can be a consequence of the different growth rates during the epitaxial deposition process inherent to each crystallographic orientation plane of the material forming the facetted epitaxy layer 902. Specifically, facets of the triangle-shaped facetted epitaxy layer 902 are bound by <111> planes. Thus, the pointed feature or upwardly-pointed tip 904 of the triangular facetted epitaxy layer 902 that forms on the extrinsic base layer 204 enhances an electric field at the upwardly-pointed tip 904, which may thereby facilitate location controllability for current conducting filaments in a subsequently formed RRAM device, as will be described in detail below with reference to FIG. 11. However, in some embodiments, the epitaxial material grown on the extrinsic base layer 204 may have a shape different than the triangular shape shown in the figure (e.g., a flat top shape).

In an embodiment, the facetted epitaxy layer 902 may be made of a semiconductor material similar to the one forming the extrinsic base layer 204 (i.e., single-crystalline Si). In other embodiments, the facetted epitaxy layer 902 may be made of a semiconductor material that is different than the one forming the extrinsic base layer 204. In a preferred embodiment, each of the extrinsic base layer 204 and the facetted epitaxy layer 902 are formed with a high dopant concentration that could be the same or different.

For example, in an embodiment, the extrinsic base layer 204 may include doped silicon with a first concentration of p-type dopants (i.e., boron) of up to $2 \times 10^{20}$ ions/cm$^3$ while the facetted epitaxy layer 902 may include SiGe with a second concentration of p-type dopants (i.e., boron) of up to $8 \times 10^{20}$ ions/cm$^3$.

Typically, BJT structures include an extrinsic base layer made of a polycrystalline material (e.g., poly-Si or poly-SiGe). As described above, embodiments of the present disclosure provide a single-crystalline extrinsic base region with a triangle-shaped top region having enhanced electrical properties that can operate as both a bottom electrode for a subsequently formed RRAM element (FIG. 11) and an extrinsic base region for the BJT.

Accordingly, the extrinsic base layer 204 and the facetted epitaxy layer 902 form the extrinsic base region of the BJT, with a lowermost portion of the extrinsic base region defined by the extrinsic base layer 204 and an uppermost portion of the extrinsic base region defined by the facetted epitaxial layer 902. The proposed extrinsic base region configuration requires a higher bandgap energy level (EG) than the underlying intrinsic base region. In the depicted embodiment, the higher band gap in the extrinsic base region is achieved by, for example, forming a heavily doped silicon extrinsic base region (i.e., extrinsic base layer 204 and facetted epitaxy layer 902) and an intrinsic base region with 20% SiGe (i.e., the top semiconductor layer 110).

In some embodiments, the extrinsic base layer 204 and the facetted epitaxy layer 902 can be formed with a stepped or a graded doping profile. In such embodiments, the doping concentration increases as the material (e.g., Si) forming the extrinsic base layer 204 and the facetted epitaxy layer 902 is epitaxially grown. By doing this, the lowermost portion of the extrinsic base region (i.e., the extrinsic base layer 204) may have a lower dopant concentration than the uppermost portion of the extrinsic base region (i.e., the facetted epitaxy layer 902). For easy of illustration, the extrinsic base layer 204 and the facetted epitaxy layer 902 are depicted as two different layers; however, it may be understood that the extrinsic base layer 204 and the facetted epitaxy layer 902 may include one block of the same material.

Figure 11:
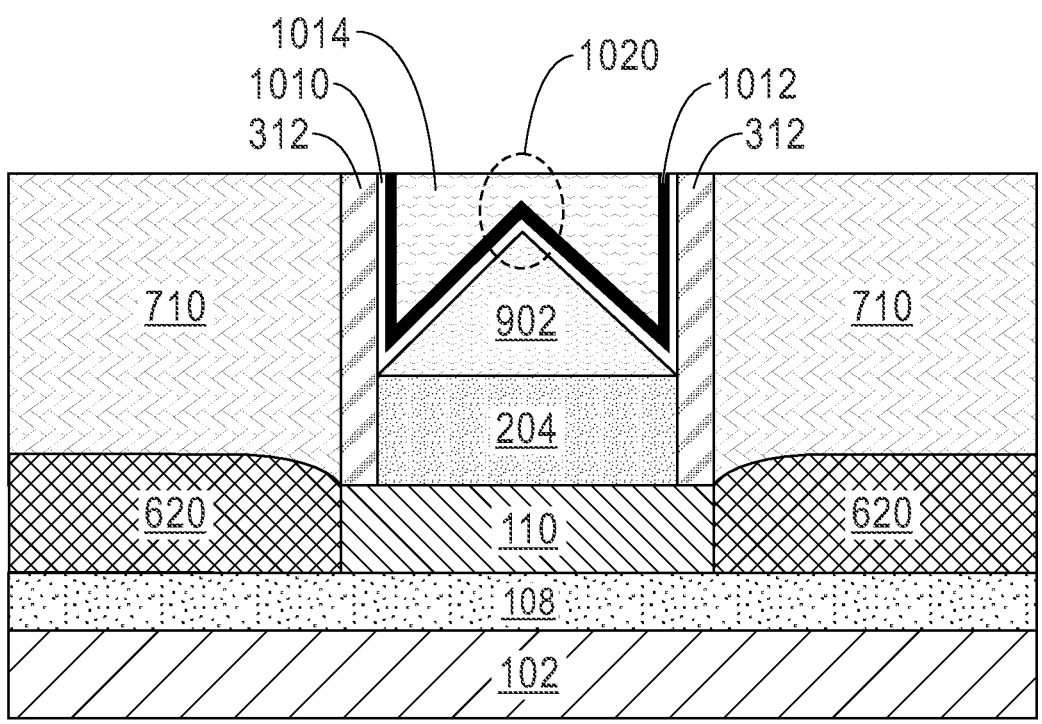
FIG. 11 is a cross-sectional view of the memory device after forming a RRAM stack, according to another embodiment of the present disclosure.

Referring now to FIG. 11, a cross-sectional view of the memory device 100 after forming a RRAM element is shown, according to an embodiment of the present disclosure.

In this embodiment, a simplistically depicted RRAM stack is formed on the memory device 100. The RRAM stack includes a bottom electrode formed by the facetted epitaxy region 902, a switching layer 1010, a top electrode layer 1012 formed above the switching layer 1010 and a metal fill 1014.

As illustrated in the figure, the switching layer 1010 is conformally deposited directly above the facetted epitaxy layer 902 using know deposition techniques such as, for example, atomic layer deposition (ALD). The switching layer 1010 substantially covers the uppermost portion of the extrinsic base region of the BJT formed by the facetted epitaxy layer 902.

The switching layer 1010 generally includes a material with switchable resistance. In this embodiment, the switching layer 1010 includes a high-k oxide material. The switching layer 1010 serves as a dielectric layer for the RRAM structure, separating the facetted epitaxy layer 902 from the top electrode layer 1012. As known by those skilled in the art, the switching layer 1010 constitutes the insulating resistance switch (RS) layer which is the principal component of the RRAM structure as it works as the storage medium. Non-limiting examples of suitable materials for the switching layer 1010 include titanium oxide (TiOx), tantalum oxide (TaOx), and hafnium oxide (HfOx). A thickness of the switching layer 110 can vary from approximately 3 nm to approximately 10 nm, and ranges therebetween. In a preferred embodiment, the switching layer 110 can have a thickness of 5 nm.

The top electrode layer 1012 is conformally deposited above the switching layer 1010. The top electrode layer 1012 may be deposited using known deposition techniques, such as, for example, ALD. The top electrode layer 1012 may be composed of a titanium nickel (TiN) alloy, a titanium nickel aluminum alloy (TiN/Al), or a titanium aluminum containing alloy, such as, a titanium aluminum carbon (TiAlC) alloy but, is not limited to these materials. The top electrode layer 1012 may have a thickness ranging from approximately 3 nm to approximately 10 nm, although other thicknesses above or below this range may be used as desired for a particular application.

Once the top electrode layer 1012 is disposed above the switching layer 1010, a metal fill 1014 is deposited above the top electrode layer 1012 using known deposition methods. After depositing the metal fill 1014, the memory device 100 undergoes a CMP process to obtain the smooth and flat surface shown in the figure. The metal fill 1014 may be made of suitable low resistivity metals, such as, for example, tungsten (W) or copper (Cu). The metal fill 1014 serves as a conductor of electricity between the top electrode layer 1012 and subsequently formed metal contacts to the RRAM structure.

As illustrated in the figure, the lowermost portion of the extrinsic region (i.e., the extrinsic base layer 204) acts as the extrinsic base of the BJT while the uppermost portion (i.e., the facetted epitaxial layer 902) acts as the bottom electrode of the RRAM structure.

Therefore, embodiments of the present invention provide a memory device, and a method of making the same, that includes a RRAM structure integrated onto the extrinsic base of a BJT structure that allows a symmetric read operation. Specifically, in the proposed embodiments, the extrinsic base of the BJT includes a heavily doped facetted epitaxy region having a triangular shape with an upwardly-pointed tip that can simultaneously function as the bottom electrode of the RRAM element and as the extrinsic base of the BJT.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device comprising:
a resistive random-access memory element electrically connected to an extrinsic base region of a bipolar junction transistor, the extrinsic base region of the bipolar junction transistor being a bottom electrode of the resistive random-access memory element;
an intrinsic base region located between an emitter region and a collector region of the bipolar junction transistor, the extrinsic base region located above the intrinsic base region;
an extrinsic base layer located above the intrinsic base region; and
an epitaxially grown material above the extrinsic base layer, the epitaxially grown material including a facetted epitaxy layer having a triangular shape with an upwardly-pointed tip.

2. The memory device of claim 1, wherein the epitaxially grown material is the bottom electrode of the resistive random-access memory element.

3. The memory device of claim 1, wherein the extrinsic base layer and the epitaxially grown material above the extrinsic base layer comprise an epitaxially grown single-crystalline semiconductor material with a high doping profile.

4. The memory device of claim 3, wherein the epitaxially grown material has a higher dopant concentration than the extrinsic base layer.

5. The memory device of claim 3, wherein the high doping profile further comprises a stepped doping profile.

6. The memory device of claim 3 wherein the high doping profile further comprises a graded doping profile.

7. The memory device of claim 1, wherein the resistive random memory stack comprises:
the bottom electrode formed by the extrinsic base region of the bipolar junction transistor;
a switching layer directly above the extrinsic base region;
a top electrode layer above the switching layer; and
a metal fill above the top electrode layer.

8. A method of writing to a memory structure comprising:
applying a first voltage on a word line of the memory structure, the memory structure comprising a resistive random-access memory element electrically connected to an extrinsic base of a bipolar junction transistor; and
forming a filament in the resistive random-access memory element, as a result of applying the first voltage.

9. The method of claim 8, further comprising:
applying a second voltage on the word line, wherein the second voltage is an opposite polarity to the first voltage, and wherein the second voltage removes a portion of the filament in the resistive random-access memory element.

10. The method of claim 9, further comprising:
applying a third voltage between the word line and at least one of a bit line and a select line, wherein applying the third voltage activates a read operation in the resistive random-access memory element.

11. The method of claim 8, wherein the extrinsic base of the bipolar junction transistor comprises a triangle-shaped top region that forms a bottom electrode of the resistive random-access memory element.

12. A method of forming a memory structure, comprising:
forming a resistive random-access memory element electrically connected to an extrinsic base region of a bipolar junction transistor, the extrinsic base region of the bipolar junction transistor being a bottom electrode of the resistive random-access memory element;
forming an intrinsic base region between an emitter region and a collector region of the bipolar junction transistor, the extrinsic base region located above the intrinsic base region;
forming an extrinsic base layer above the intrinsic base region; and
forming an epitaxially grown material above the extrinsic base layer, the epitaxially grown material including a facetted epitaxy layer having a triangular shape with an upwardly-pointed tip.

13. The method of claim 12, wherein the epitaxially grown material is the bottom electrode of the resistive random-access memory element.

14. The method of claim 12, wherein the extrinsic base layer and the epitaxially grown material above the extrinsic base layer comprise an epitaxially grown single-crystalline semiconductor material with a high doping profile.

15. The method of claim 12, wherein the epitaxially grown material has a higher dopant concentration than the extrinsic base layer.

* * * * *